(12) United States Patent
Gudeman

(10) Patent No.: US 10,050,409 B2
(45) Date of Patent: Aug. 14, 2018

(54) MICROFABRICATED OPTICAL APPARATUS WITH GROUNDED METAL LAYER

(71) Applicant: Innovative Micro Technology, Goleta, CA (US)

(72) Inventor: Christopher S. Gudeman, Lompoc, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/894,170

(22) Filed: Feb. 12, 2018

(65) Prior Publication Data

US 2018/0166850 A1 Jun. 14, 2018

Related U.S. Application Data

(63) Continuation-in-part of application No. 15/272,481, filed on Sep. 22, 2016.

(51) Int. Cl.
| | |
|---|---|
| *H04B 10/00* | (2013.01) |
| *H01S 5/02* | (2006.01) |
| *B81B 7/00* | (2006.01) |
| *B81C 1/00* | (2006.01) |
| *H01S 5/022* | (2006.01) |
| *H01S 5/40* | (2006.01) |
| *H04J 14/02* | (2006.01) |
| *H04B 10/40* | (2013.01) |
| *H01S 5/00* | (2006.01) |
| *H04J 14/00* | (2006.01) |

(52) U.S. Cl.
CPC .......... *H01S 5/0206* (2013.01); *B81B 7/0067* (2013.01); *B81C 1/00301* (2013.01); *H01S 5/0064* (2013.01); *H01S 5/02248* (2013.01); *H01S 5/02284* (2013.01); *H01S 5/02288* (2013.01); *H01S 5/4087* (2013.01); *H04B 10/40* (2013.01); *H04J 14/02* (2013.01)

(58) Field of Classification Search
CPC ........ H04B 10/40; G02B 6/42; G02B 6/4201; G02B 6/4256; G02B 6/4257; G02B 6/4274; G02B 6/4279
See application file for complete search history.

(56) References Cited

U.S. PATENT DOCUMENTS

| | | |
|---|---|---|
| 7,233,048 B2 | 6/2007 | Rybnicek et al. |
| 7,528,691 B2 | 5/2009 | Wallis et al. |
| 7,864,006 B2 | 1/2011 | Foster et al. |
| 7,893,798 B2 | 2/2011 | Foster et al. |
| 8,343,791 B2 | 1/2013 | Foster et al. |

(Continued)

*Primary Examiner* — Daniel Dobson
(74) *Attorney, Agent, or Firm* — Jaquelin K. Spong

(57) ABSTRACT

A microfabricated optical apparatus that includes a light source driven by a waveform, wherein the waveform is delivered to the light source by at least one through silicon via. The microfabricated optical apparatus may also include a light-sensitive receiver which generates an electrical signal in response to an optical signal. The electrical signal may be communicated to external devices by at least one additional through silicon via, and the signals routed to the encapsulated devices by metal traces. The vias may couple a ground plane to a metal trace layer at intervals, effectively quashing the ability of the bondline to interfere with the absorbed or radiated signal frequency.

20 Claims, 12 Drawing Sheets

(56) References Cited

U.S. PATENT DOCUMENTS

| | | | |
|---|---|---|---|
| 2003/0123818 A1* | 7/2003 | Watanabe | G02B 6/4201 |
| | | | 385/92 |
| 2011/0008056 A1* | 1/2011 | Yagisawa | G02B 6/4201 |
| | | | 398/182 |
| 2013/0272649 A1* | 10/2013 | Braunisch | G02B 6/12 |
| | | | 385/14 |
| 2014/0203175 A1* | 7/2014 | Kobrinsky | G02B 6/428 |
| | | | 250/214.1 |
| 2015/0069618 A1 | 3/2015 | Gudeman et al. | |
| 2016/0093530 A1 | 3/2016 | Harley et al. | |

\* cited by examiner

MICROFABRICATED OPTICAL APPARATUS WITH GROUNDED METAL LAYER

CROSS REFERENCE TO RELATED APPLICATIONS

This US nonprovisional patent application is a continuation-in-part, and claims priority to U.S. patent application Ser. No. 15/272,481, filed Sep. 22, 2016, which is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to integrated circuit and microelectromechanical systems (MEMS) devices. More particularly, this invention relates to a microfabricated optical apparatus.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to switch electrical signals. Because of its small size and fragile structure, the movable cantilever may be enclosed in a cavity to protect it and to allow its operation in an evacuated environment. Therefore, upon fabrication of the moveable structure on a "device" wafer, the device wafer may be mated with a lid wafer, in which depressions or device cavities have been formed to allow clearance for the structure and its movement. To maintain the vacuum over the lifetime of the device, a getter material may also be enclosed in the device cavity upon sealing the lid wafer against the device wafer.

One such device that may be manufactured using MEMS techniques is an microfabricated optical table. Microfabricated optical tables may include very small optical components which may be arranged on the surface of a substrate in a manner analogous to a macroscopic optical components mounted on a full sized optical bench. These microfabricated components may include light sources such as light emitting diodes (LED's) or semiconductor lasers, beam shaping structures such as lenses, turning mirrors and waveguides, and modulation devices such as Mach-Zehnder interferometers or Electro Absorbtive Modulators. After fabrication, these devices may be enclosed with a lid wafer to protect them in an encapsulated device cavity. Some devices, such as infrared detectors and emitters, may require a vacuum environment, such that the device cavity may need to be hermetically sealed.

In order to control such a microfabricated element, electrical access must be provided that allows power and signals to be transmitted to and from the elements. Previously, these signal lines were routed under the bond lines between the lid wafer and the device wafer. Because the enclosed elements may be delicate, the bondlines may be, for example, metal alloy bondlines that are activated at relatively low processing temperatures. However, the presence of the flat metal bondlines directly adjacent to potentially high frequency signal lines may cause unwanted capacitance in the structure, limiting its high frequency performance.

Accordingly, encapsulated microfabricated high frequency optical structures have posed an unresolved problem.

SUMMARY

A method is described which can be used to make microfabricated optical tables using conductive vias which extend through the thickness of the substrate material. This disclosure further describes an architecture with advantageous noise suppression and loss characteristics with respect to the vias, and the signals transmitted thereby.

A feature of this process is that conductive vias may be formed in a relatively insulative surrounding material of the substrate. These vias may supply power and signals to/from the components inside a hermetically sealed device cavity. The signal and power lines may be delivered to the sealed device cavity with a through substrate via (TSV). The TSV may have a bonding pad on one side of the substrate, and a conductive pathway leading to the devices within the device cavity.

In order to reduce the RF coupling between the TSVs and other metallic structures, or into the surrounding environment, the package may include a grounded metal layer, patterned to have a particular shape and RF inductance characteristics. In one embodiment, a microfabricated structure is disclosed which supports RF signals having a characteristic wavelength of $\lambda$ (which corresponds to a characteristic frequency $v$ of between about $c/(v*\varepsilon)$ and $c/(10*v*\varepsilon$, where c is the speed of light and epsilon is the dielectric constant of the material). The structure may include a metallic layer on one side, such as a bond line or a metal trace layer, and a ground plane on the obverse side, which may be held at ground potential relative to another metal layer. A plurality of through wafer vias may extend through the substrate, and define conductive paths between the ground plane and the metal layer. The through wafer vias (TSVs) may be disposed at intervals of between about $2\lambda$ and $\lambda/10$. The vias may couple a ground plane to a metal trace layer at intervals, effectively quashing the ability of the bondline to interfere with the absorbed or radiated signal frequency.

Accordingly, this architecture avoids the large capacitive losses that may occur with the under-bond routing of these electrical leads. These vias may be located at intervals in the bondline, and may be electrically coupled to a grounded plane. This may cause the bondline to be grounded at intervals, such that it does not participate, or interfere with, the operation of the TOSA/ROSA, as described further below.

In some embodiments, the encapsulated components may include turning mirrors, optical rotators and isolators, light emitters and optical lenses. Using this architecture, the turning mirror may be a reflective surface formed on a surface of the lid wafer, or it may be a separate component formed on the device wafer surface.

In another embodiment, the microfabricated optical apparatus may include an optical receiver as well as an optical transmitter. The receiver may be, for example, a photosensitive diode. The embodiment may also include two optical isolators, one to separate incoming from outgoing radiation. The incoming radiation may be directed onto the optical receiver through a beam shaping element such as a ball lens. Accordingly, in this embodiment, the microfabricated optical apparatus may be fabricated on a substrate, and may include a light source driven by a signal, wherein the light source generates optical radiation. The apparatus may also include a light detector which may also be disposed within the device cavity. The light detector may detects an amount of optical radiation, wherein the signal is delivered to the light source or taken from the optical detector by at least one through silicon via (TSV) which extends through a thickness of the substrate. Two such optical apparatuses may be disposed on either end of a fiber optic transmission line, allowing two-way communication across the fiber optic.

Accordingly, a microfabricated optical apparatus manufactured on a substrate, is described. The device may include an optical source driven by a first signal with a characteristic frequency of ν, wherein the optical source generates optical radiation. The device may further include an optical detector which generates a second signal based on an amount of optical radiation striking the optical detector, wherein the first and second signals are delivered to the optical source or taken from the optical detector by a plurality of through silicon vias (TSV) which extend through a thickness of the substrate.

In order to reduce the cross talk between the optical source and the optical detector, a metallic layer may be deposited on at least one side of the substrate and covering at least one half of area of the surface of the substrate. This metal layer may be electrically coupled to a ground plane on the obverse side of the substrate by the plurality of through substrate vias (TSVs). These TSVs may be arranged in a row between the source and the detector, or they may be arranged in a region between the source and the detector, where the lid wafer is bonded to the device wafer, or they may be randomly distributed. But in any case, the interval between these TSVs may be a fraction of the wavelength of the radiation being handled by the device.

A method is also disclosed for forming an optical apparatus with this structure, wherein the optical apparatus supports signals having a characteristic wavelength of λ corresponding to a characteristic frequency of ν, is also disclosed. The method may include disposing an optical source on a substrate, wherein the optical source generates optical radiation, disposing an optical detector on the substrate, which generates a second signal based on an amount of optical radiation striking the optical detector, wherein the first and second signals are delivered to the optical source or taken from the optical detector by a plurality of through silicon vias (TSV) which extend through a thickness of the substrate. The method may then include forming a plurality of through wafer vias extending through the substrate, that define a conductive path between a ground plane on one side of the substrate and a metal material on the obverse side of the substrate, wherein the through substrate vias are disposed at intervals of between about $c/(v*\varepsilon)$ and $c/(10*v*\varepsilon)$, where c is the speed of light and epsilon is the dielectric constant of the substrate, and wherein the metal material covers at least one half of the exposed area of the surface of the substrate, and forming the ground plane which is held at ground potential relative to the wafer bonding material. The metal material may be coupled to the ground plane by the plurality of through substrate vias (TSVs).

Numerous devices can make use of the systems and methods disclosed herein. In particular, high speed, compact telephone or communications switching equipment may make use of this architecture. RF switches benefit from the reduced capacitive coupling that an insulative substrate can provide. High density vias formed in the insulative substrate increase the density of devices which can be formed on a substrate, thereby reducing cost to manufacture. Other sorts of substrates, for example, metal or semiconducting substrates may make use of an insulating layer to provide isolation between the conductive via and the surrounding substrate. The performance of such devices may also be improved, in terms of insertion loss, distortion and isolation figures of merit.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

Figure 1:
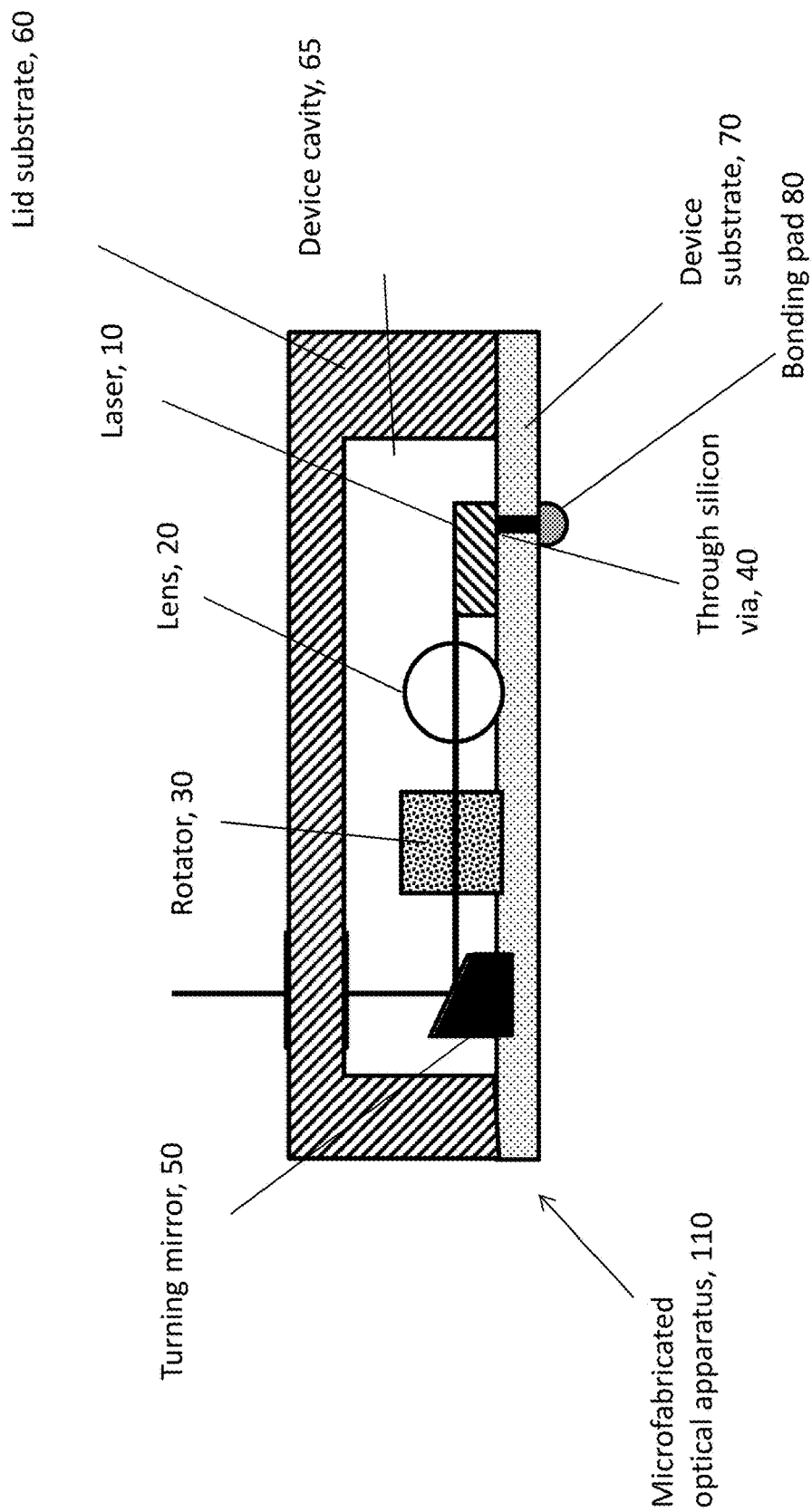
FIG. 1 is a schematic, cross sectional illustration of a first embodiment of a microfabricated optical apparatus.

The systems and methods described herein may be particularly applicable to microfabricated optical tables, wherein small optical devices are formed on a substrate surface and enclosed with a lid wafer. The optical devices may include light sources such as light emitting diodes (LED's), beam shaping structures such as lenses and turning mirrors, and modulation devices such as Faraday rotators and optical isolators.

After fabrication, these devices may be enclosed with a lid wafer to protect them in an encapsulated device cavity. These devices, including optical detectors and optical or laser emitters, may require a vacuum environment, such that the device cavity may need to be hermetically sealed. The signal and power lines may be delivered to the sealed device cavity with a through substrate via (TSV). The TSV may have a bonding pad on one side of the substrate, and a conductive line leading to the device within the device cavity on the obverse side.

Through substrate vias may be particularly convenient for MEMS devices, because they may allow electrical access to the encapsulated devices. Without such through holes, electrical access to the MEMS device may have to be gained by electrical leads routed under the lid wafer which is then hermetically sealed. It may be problematic, however, to achieve a hermetic seal over terrain that includes the electrical leads unless more complex and expensive processing steps are employed. This approach also makes radio-frequency applications of the device limited, as electromagnetic coupling will occur from the metallic bondline residing over the normally oriented leads.

One of the problems with prior art devices is that the leads that drive the laser emitter are necessarily routed under the bond lines that bond the lid wafer 6 to the device wafer 7. Accordingly, a large capacitive coupling may occur, with commensurately large losses especially at high frequencies. Although the devices may be smaller and lower cost than a TO-can packaging with ceramic carrier, the performance of the device may suffer from the aforementioned capacitive coupling, especially at higher frequencies.

The systems described here may include a grounded metal layer, patterned to have a particular shape and RF inductance characteristics. In one embodiment, a microfabricated structure is disclosed which supports RF signals having a characteristic wavelength of $\lambda$ (which corresponds to a characteristic frequency $v$ of between about $c/(v*\epsilon)$ and $c/(10*v*\epsilon)$, where c is the speed of light and epsilon is the dielectric constant of the material). The structure may include a metallic layer such as a bond line or a metal trace layer, and a ground plane which may be held at ground potential relative to another metal layer. The system may include a plurality of TSVs. The metal layer may then be used to ground the TSVs at intervals, thus reducing their ability to interact with the RF radiation.

Accordingly, the systems and methods described herein may be particularly applicable to encapsulated optical tables, such as an LED, shaping lens, rotator/isolator and turning mirror, all enclosed in the device cavity. Exemplary embodiments of the novel optical apparatuses are illustrated in FIGS. 1-11.

FIG. 1 shows a first embodiment 110 of the systems and methods disclosed here. In FIG. 1, there may be a laser light source 10 which produces a beam of light which may be shaped by a ball lens 20 and then through Faraday rotator 30. The beam of light then impinges on a turning surface 50 which redirects the light in a direction normal to the substrate, shown upward in FIG. 1. The light may pass through the lid substrate 60 which may encapsulate the aforementioned devices disposed on the device substrate 70. In FIG. 1, the turning surface is a turning mirror 50, which is a discrete structure, encapsulated in the device cavity along with the other components.

Suitable materials for the device substrate 70 and lid substrate 60 may be a metal or semiconductor such as silicon, or a ceramic or glass. The device cavity 65 may be etched into the lid wafer 60 using, for example, deep reactive ion etching (DRIE). The depth of the device cavity may be several hundred microns and have sufficient lateral extent to easily cover the components shown in FIGS. 1-9b. Accordingly, the aforementioned components, including turning mirror 50, rotator 30, lens 20 and light source 10 may be disposed in the device cavity 65, such that the device cavity 65 encloses and encompasses the optical apparatus 110.

The laser 10 may be a light emitting laser diode for example, that can be driven by power and signal lines which are delivered to the laser 10 by one or more through silicon vias (TSVs) 40. These vias 40 are formed through the thickness of the device wafer 70. A number of references describe methods for making such through wafer vias 40. In the embodiment shown in FIG. 1, a discrete turning mirror 50 directs the beam of light from the laser 10, ball lens 20 and Faraday rotator 30 to a direction normal to the substrates. The beam of light may exit through the lid substrate 60.

This embodiment may make use of, for example, a single mode, distributed feedback (DFB) edge-emitting laser located within the device cavity, and thereby separated from the environment by a hermetic seal. The single mode, edge emitting diode may be capable of higher data rates than a multimode vertical cavity surface emitting lasers (VCSELs), such that this embodiment may have both performance and cost advantages. The DFB laser may be modulated directly by a signal or waveform fed to the DFB laser through the through silicon via, or it may be driven by a direct current (DC) electrical signal applied to the TSV. However, it should be understood that the light source 10 may be at least one of a light emitting diode, a laser diode, an edge emitting laser diode, a laser diode, and a vertical cavity surface emitting laser. The electrical access to the TSV 40 may be provided by a bonding pad 80, to which macroscopic electrical connections may be made. In the embodiments shown in FIG. 1, because the light is emitted through the lid substrate and thus on the obverse side compared to the electrical connections, this embodiment may be particularly convenient for coupling to a printed circuit board or thin film circuit.

Figure 2:
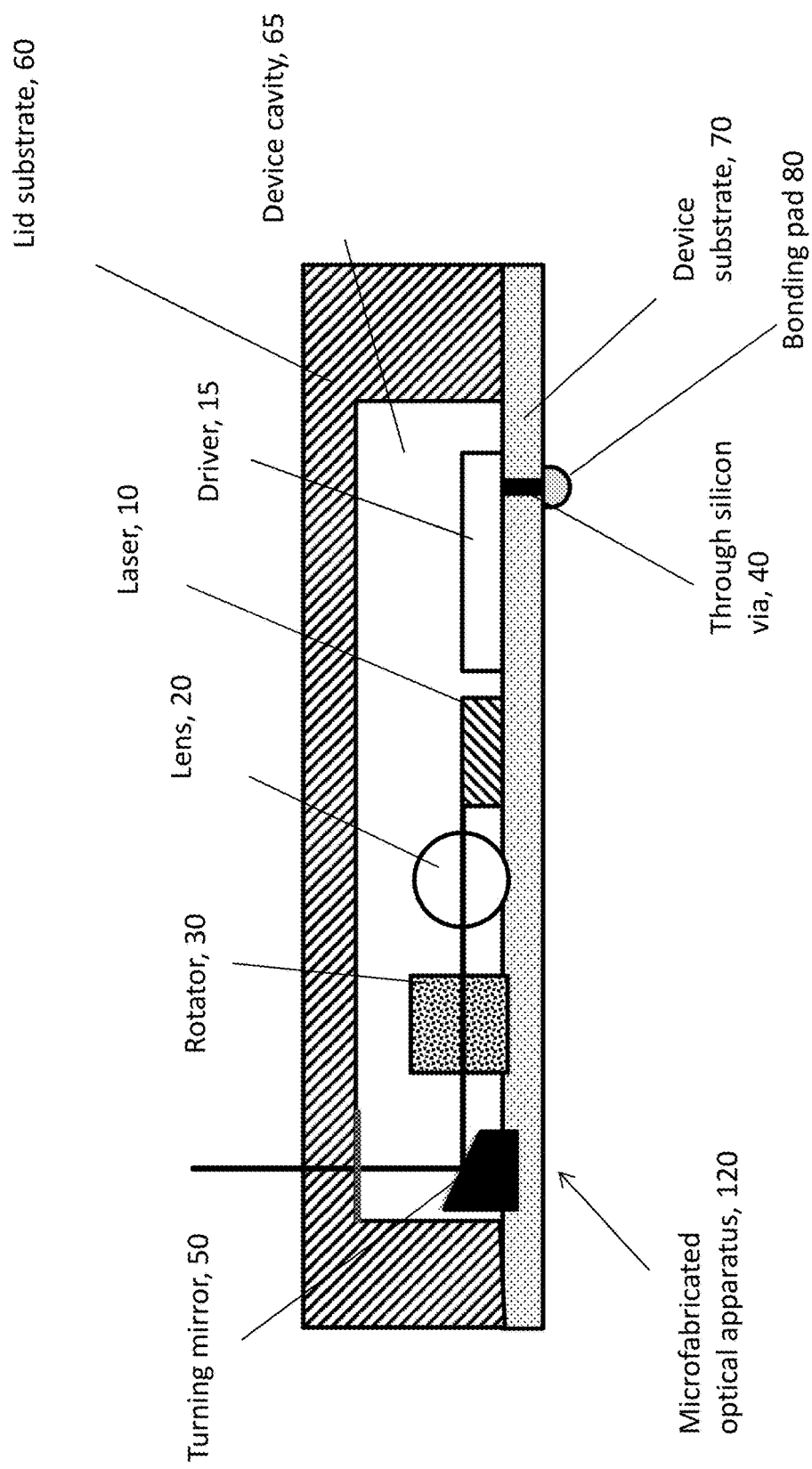
FIG. 2 is a schematic, cross sectional illustration of a second embodiment of a microfabricated optical apparatus.

FIG. 2 shows another embodiment 120 of the MEMS silicon optical apparatus. This second embodiment is similar to that shown in FIG. 1, except that in this embodiment, there is also a driver 15 that drives the laser 10 with a particular pattern or modulation that may represent data to be communicated over the optical link. Like the previous embodiment, there is once again a laser light source 10, which produces a beam of light which may be shaped by a ball lens 20, and then modulated by a Faraday rotator 30. The beam of light then impinges on a turning surface 50 which redirects the light in a direction normal to the substrate, shown as upward in FIG. 2. The light may pass through the lid substrate 60 which encapsulates the aforementioned devices disposed on the device substrate 70. In FIG. 2, the turning surface is a turning mirror 50, which is a discrete structure, encapsulated in the device cavity 65 along with the other components. As in the previous embodiment, the laser is driven by through substrate vias 40, which may improve the high frequency characteristics of the device. The electrical access to the TSV may be provided by a bonding pad 80, to which macroscopic electrical connections may be made. In the embodiment shown in FIG. 2, because the light is emitted through the lid substrate and thus on the obverse side compared to the electrical connections, this embodiment may be particularly convenient for coupling to a printed circuit board or thin film circuit. In the embodiment shown in FIG. 2, the TSVs 40 may conduct a direct current (DC) signal to the driver 15, which then modulates the signal to encode information thereon. Accordingly, this embodiment may include the power driver inside the hermetic package, and the close proximity of the compact device cavity provides for reduced power consumption. Therefore, the microfabricated optical apparatus may further comprise a device which modulates at least one of a frequency and an amplitude, to encode the optical radiation emitted from the light source with an information signal.

Otherwise, the embodiment shown in FIG. 2 may be similar to that shown in FIG. 1, and the turning mirror 50 may direct the optical radiation to exit the device cavity through a roof of the lid wafer, in a substantially parallel direction relative to the through silicon via 40.

Figure 3:
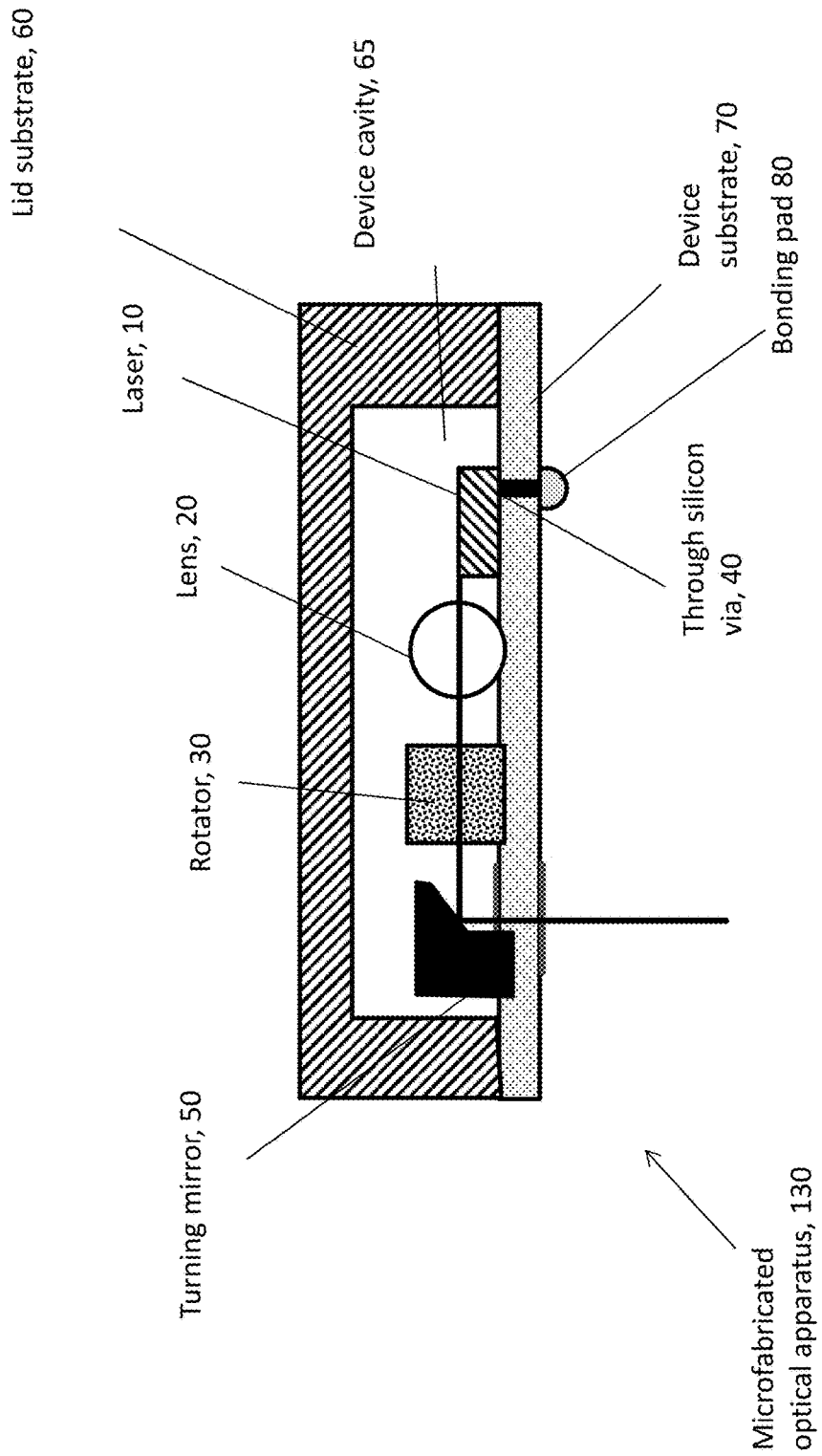
FIG. 3 is a schematic, cross sectional illustration of a third embodiment of a microfabricated optical apparatus.

FIG. 3 shows a third embodiment 130, wherein the turning mirror 50 directs the beam of light downward through the device substrate 70 rather than upward through the lid wafer 60. As in the previous embodiments, the laser 10 may be driven by through substrate vias 40, which may improve the high frequency characteristics of the device. The output of this embodiment may be generally downward on the same side of the device as the electrical connections are made. Accordingly, in contrast to the embodiment shown in FIGS. 1 and 2, the optical apparatus in FIG. 3 has a turning mirror 50 which may bend the optical radiation to exit the device cavity through the device substrate 70, rather than through the lid wafer 60, and in a substantially parallel direction relative to the through silicon via.

Figure 4:
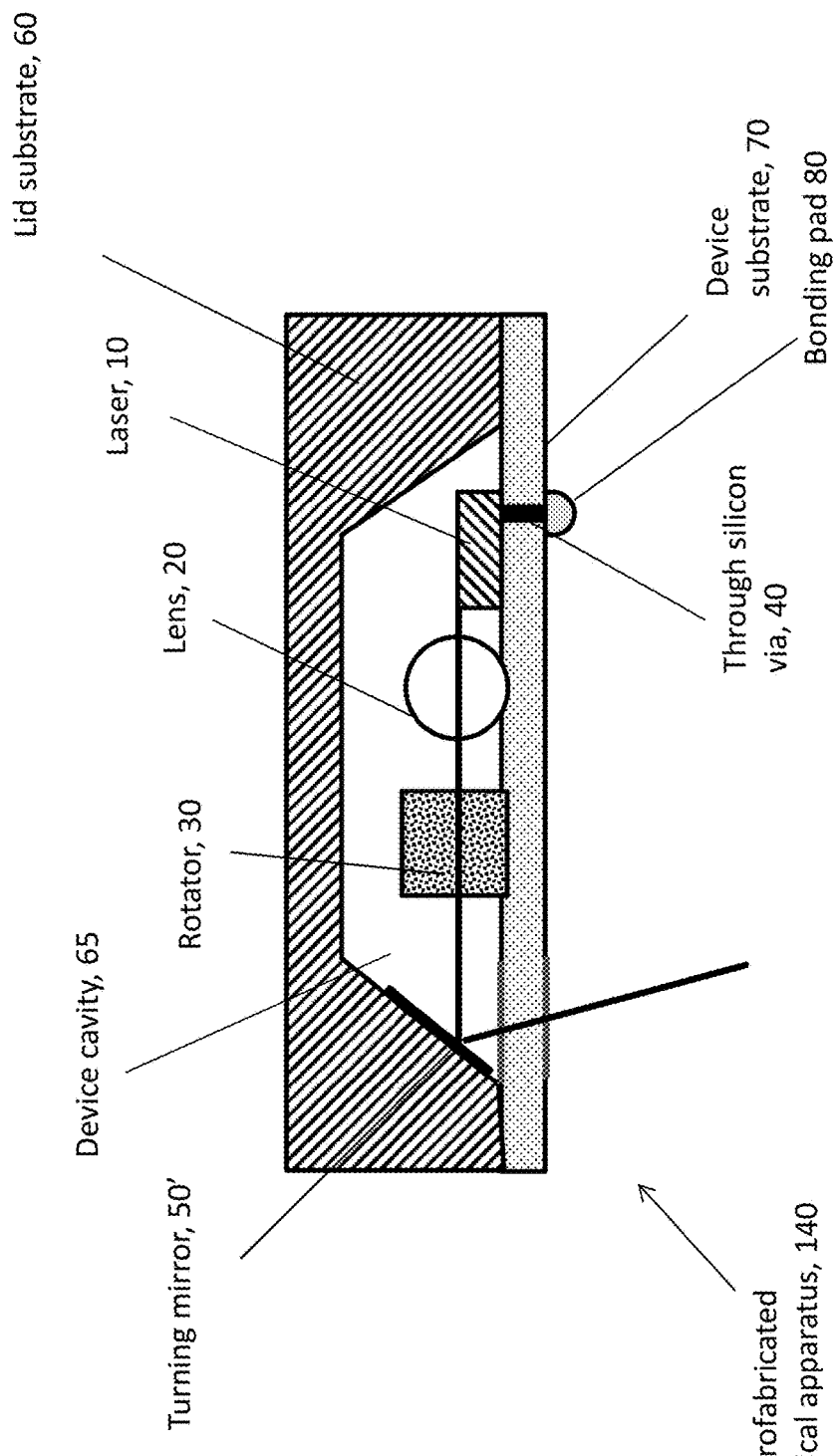
FIG. 4 is a schematic, cross sectional illustration of a fourth embodiment of a microfabricated optical apparatus.

FIG. 4 shows a fourth embodiment 140 of the MEMS silicon optical apparatus, wherein the turning surface 50' is formed by a reflective surface on the lid wafer. This surface may be formed by anisotropic etching, followed by the deposition of a reflective coating on the lid wafer 60 surface. The reflective surface may be a thin film of gold (Au) or silver (Ag) or it may be a multilayer film with layer thicknesses designed to enhance reflectivity of the particular wavelength.

As in the previous embodiments, there is once again a laser light source 10, which produces a beam of light which may be shaped by a ball lens 20, and then modulated by a Faraday rotator 30. The beam of light then impinges on a turning surface 50' which redirects the light through the substrate, shown as generally downward in FIG. 4. The light may pass through the device substrate 70 on which the aforementioned devices are fabricated, in a non-normal way (with respect to the substrate). Accordingly, the light may exit the substrate in a direction not parallel to the through substrate vias (TSVs) 40. As in the previous embodiments, the laser may be driven by through substrate vias 40, which may improve the high frequency characteristics of the device. The embodiment may have the advantage of simpler fabrication. Accordingly, in some embodiments, the microfabricated optical apparatus may generate optical radiation which exits the device cavity 65 through a sidewall of the device cavity 65 in the lid wafer 60, at an angle with respect to the through silicon via 40. In this case, the turning surface may be a reflective film deposited on a sidewall of the device cavity, wherein the sidewall is inclined with respect to a surface of the substrate by about 50 to 60 degrees. The turning surface may be a reflective film deposited on an inclined surface of an optical element located within the device cavity.

Figure 5:
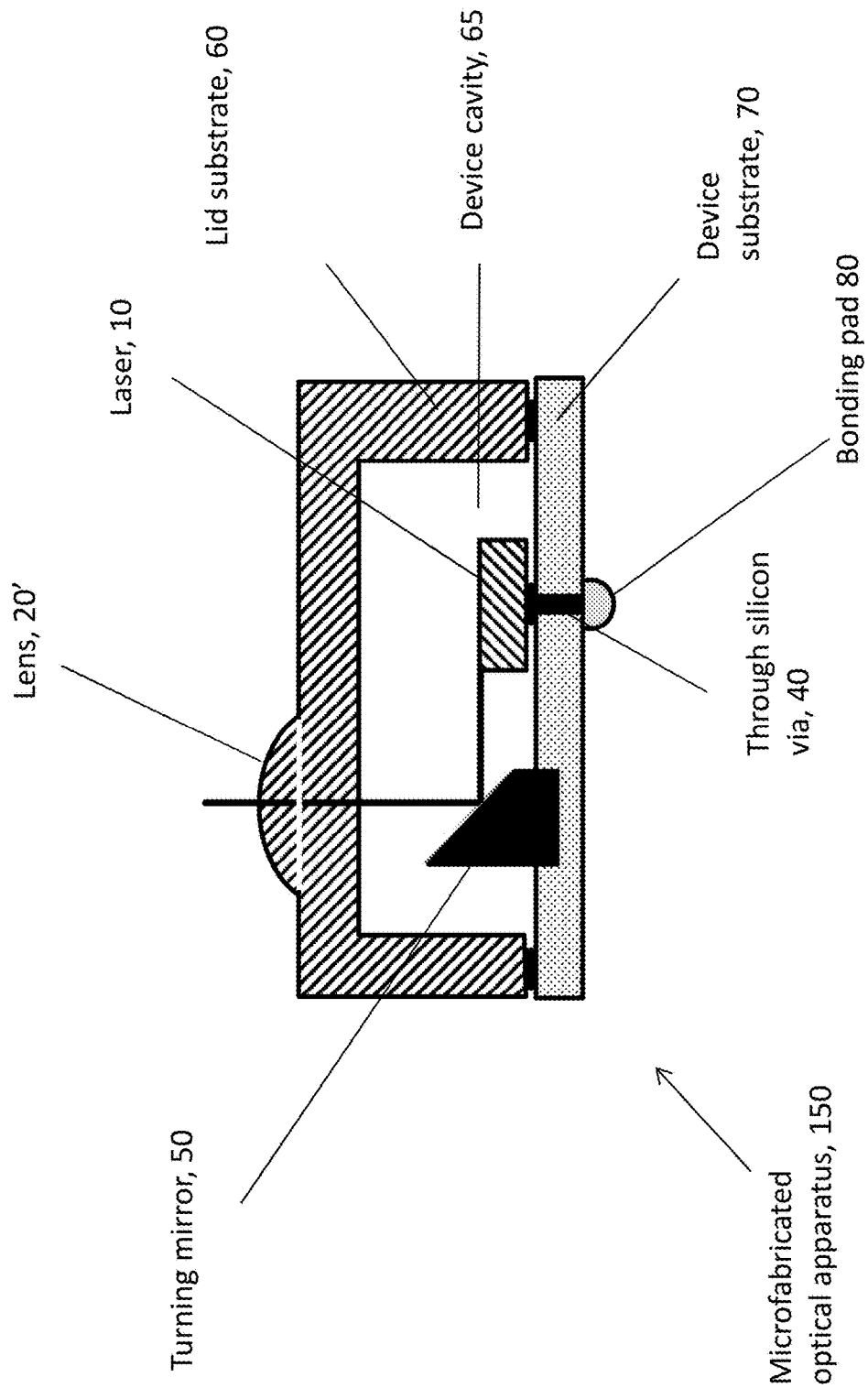
FIG. 5 is a schematic, cross sectional illustration of a fifth embodiment of a microfabricated optical apparatus.

FIG. 5 shows a fifth embodiment 150 of the MEMS silicon optical apparatus, wherein a laser 10 generates a beam of light which is redirected upward by turning mirror 50. This turning mirror 50 directs the light upward through the lid substrate 60. A feature lens 20', may be formed on lid substrate 60 which can shape the beam of light as it passes therethrough. This embodiment is shown lacking some of the components described previously with other embodiments, such as the ball lens, Faraday rotator or isolator, and driver. It should be understood that these additional components may optionally be supplied with this embodiment as well. In FIG. 5, a horizontal line at the base of the lens 20' may suggest that lens 20' is a separate, distinct element. It should be understood that this horizontal line may be an artifact of the rendering of the illustration, and that lens 20' may be formed from a monolithic piece of silicon as described below.

The feature lens 20' may be formed using grey scale lithography, which makes use of a thick photoresist. "Thick resists" means, that the resist film thickness is much higher than the penetration depth of the exposure light. For standard positive resists and standard exposure wavelengths (g-, h-, i-line), this means a thickness of >5 µm. (Of course, if small wavelengths with a very low penetration depth such as 310 nm are used, even a 1 µm resist film will be "thick" in this context). Under these conditions, the resist film cannot be completely exposed towards the substrate. However, the resist may be bleached in the process as follows: In the beginning of the exposure, light only penetrates the upper 1-2 µm of the resist film. This part of the resist film bleaches, so with the ongoing exposure, light will be able to penetrate the first 2-3 µm of the film, and so on. As a consequence, the exposed (and developable) resist film thickness goes approximately linearly with the exposure dose. The transition exposed/ unexposed is sufficiently sharp for reproducible greyscale lithography applications.

When the grayscale exposed resist is used in an etching process such as the one used to make lens 20', the thin areas of the grayscale resist are removed early on, leading to relatively deeply etched features. The thicker areas of resist persist through the etching step, leading to shallowly etched features. Accordingly, the dome-shaped lens 20' is produced by having thin portions of the grayscale resist cover the horizontal surface of the substrate, and the thickest areas over the top of the dome of the lens 20'

Accordingly, grayscale lithography may be used to form a lens 20' on either the outer surface or the inner surface of the roof of the device cavity lid substrate. A lens 20' is shown on the outer surface in FIG. 5. Thus, the microfabricated optical apparatus may include a beam shaping element which is a lens formed in a roof of the device cavity.

As in the previous embodiments, there is once again a laser light source 10, which produces a beam of light which may be shaped by a ball lens 20, and then modulated by a Faraday rotator 30. The beam of light then impinges on a turning surface 50 which redirects the light in a direction normal to the substrate, shown as upward in FIG. 5 and downward in FIG. 3. The light may pass through the lid substrate 60 which may encapsulate the devices disposed on device substrate 60. As in the previous embodiments, the laser may be driven by through substrate vias 40, which may improve the high frequency characteristics of the device. The embodiment shown in FIG. 5 is shown lacking some of the components described previously with other embodiments, such as the ball lens, Faraday rotator or isolator, and driver. It should be understood that these additional components may optionally be supplied with this embodiment as well. The lens 20' may serve to shape, focus or collimate the light emitted from light source 10 as driven through the through silicon via (TSV).

Figure 6:
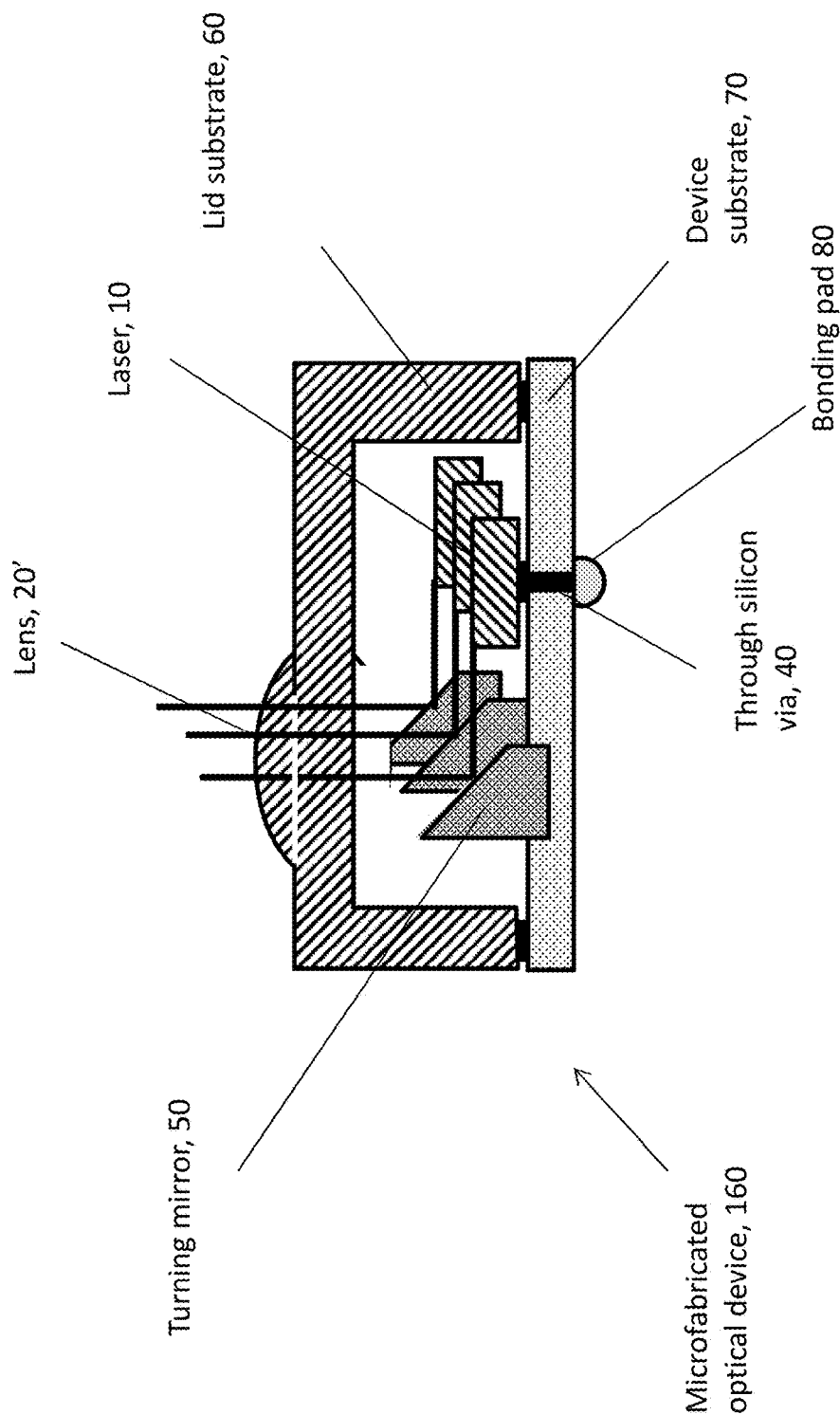
FIG. 6 is a schematic, cross sectional illustration of a sixth embodiment of a microfabricated optical apparatus with a plurality of light sources.

FIG. 6 shows a sixth embodiment 160 of the MEMS optical apparatus, wherein a plurality of lasers 10 each generate a beam of light which is redirected by turning mirrors 50. These turning mirrors 50 may direct the light in the same or different directions as the other light sources. One or more lenses 20", may be formed on lid substrate 60 which can shape the beams of light as they pass through. This embodiment is shown lacking some of the components described previously with other embodiments, such as the ball lens, Faraday rotator or isolator, and driver. It should be understood that these additional components may optionally be supplied with this embodiment as well. As shown in FIG. 6, the methods described here may be capable of manufacturing microfabricated optical apparatuses, wherein a plurality of light sources may be disposed in a single, compact device cavity, along with the associated components. This plurality of light sources can be selected to operate at differing wavelengths, thus allowing data encoded on each wavelength to be transmitted together in a single optical fiber and then be separated from each other at the receiver end by use of a diffraction grating or discrete filters.

The through silicon vias (TSVs) 40 which are shown in each of FIGS. 1-6 may be made by a number of techniques. In one approach, blind via holes are etched into the front side of a silicon substrate, but not extending through the thickness, such that material remains on the backside of the substrate. An insulating layer, for example, silicon dioxide $SiO_2$ may then be grown on the bare silicon walls and within the hole. A plating seed layer may then be deposited conformally in the hole. A conductive material such as copper, may then be plated into the hole. Finally, the remaining material may be removed from the backside of the substrate to expose the copper by, for example, grinding. The conductive copper may thereby extend through the thickness of the substrate 70. Additional details as to this method of making through silicon vias may be found in co-owned U.S. Pat. No. 7,233,048, which is incorporated by reference in its entirety.

Other methods may be used to form the vias, and some may be more appropriate for some substrate materials than others. These alternative methods may be found in, for example, U.S. patent application Ser. No. 11/482,944, U.S. Pat. No. 8,343,791, U.S. patent application Ser. No. 14/499, 287 and U.S. patent application Ser. No. 13/987,871. Each of these documents in incorporated by reference in their entireties, and each is owned by the owner of the instant invention.

The other optical components may be obtained as discrete devices, and disposed on the fabrication substrate by pick and place machines, similar to those used in printed circuit board manufacture to place components. These discrete optical elements may be held in place by epoxy or glue. The light source 10 may require a conductive bonding material to maintain conductivity with the through silicon via. This conductive bonding material may be, for example, a relatively low temperature gold/tin alloy bond.

As mentioned previously, the lid substrate 60 may have a device cavity 65 etched therein using, for example, deep reactive ion etching (DRIE) or anisotropic etching. Anisotropic etching tends to form sidewalls with a 56 degree slope with respect to vertical, whereas DRIE tends to make very sharp, very vertical features. Anisotropic etching may be used on the embodiment shown in FIG. 4, whereas DRIE may be used in the embodiments shown in FIGS. 1-3, and 5-7. The 56 degree sidewall angle may be convenient for fabricating a reflective surface in order to direct the radiation out of the cavity.

After fabrication of the lid substrate 60 and placement of the optical elements within the perimeter of the device cavity, the lid substrate 60 may be bonded to the silicon device substrate 70. The bonding material may be, for example, a low temperature metal alloy bond such as gold/indium, which is formed at about 156 centigrade. Additional details as to methods for bonding with a gold and indium alloy may be found in U.S. Pat. No. 7,569,926, incorporated by reference in its entirety.

In modern data centers, optical fibers are used to interconnect the thousands of server computers that are racked together side by side. Because the data centers have grown and the number of servers has increased, the weight and girth of the fibers has become a significant problem during data center construction. Thus it is desirable to reduce the number of fibers. We describe below a method to carry two directional optical traffic down each fiber, using an embodiment of a microfabricated optical apparatus. This reduces the number of fibers in half.

In fiber-optic communications, wavelength-division multiplexing (WDM) is a technology which multiplexes a number of optical carrier signals onto a single optical fiber by using different wavelengths (i.e., colors) of laser light, thus multiplying the fiber's capacity. WDM systems are divided into different wavelength patterns, coarse (CWDM) and dense (DWDM).

Accordingly, both coarse WDM (CWDM) and Dense WDM (DWDM) are currently used to increase the data rate down a given fiber. These methods rely on launching independently modulated optical signals at several wavelengths into each fiber. Each wavelength is generated by a separate laser. This optical energy is modulated in one of several methods to encode the data that is to be transmitted. These individual wavelengths are combined into a single beam in an optical multiplexer and then launched into the long optical fiber that interconnects the servers. At the other end of each fiber, the light is dispersed using a grating and each of the now separated wavelengths is detected and demodulated.

Whereas this method increases the throughput of each fiber, the data in each fiber travels in only one direction. Bi-direction communication between servers is required, so CWDM and DWDM require that pairs of fibers be used, one for outgoing data and the other for incoming data.

The method described here enables bi-directional communication on a single fiber. This can be implemented in a low cost application, which might have only one laser, or in a higher cost system that employs CWDM or DWDM. This concept includes a Transmit Optical Sub-Assembly (TOSA) and a Receive Optical Sub-Assembly (ROSA), which in combination are referred to as a microfabricated TOSA/ROSA apparatus. The TOSA/ROSA apparatus may be micro-fabricated on a single substrate, known as a Silicon Optical Bench (SiOB). The TOSA portion may use an edge emitting laser, a collimating ball lens, and an optical isolator, for example. The ROSA portion may use a second optical isolator (oriented in the opposite direction), a second collimating ball lens, and a photodiode (PD) as the optical detector, for example. An optical waveguide is fabricated on the SiOB that a) routes the laser light into the external optical fiber and b) routes the oppositely propagating light from the optical fiber to the PD. One each of these SiOBs is attached at the each end of the optical fiber.

Figure 7A:
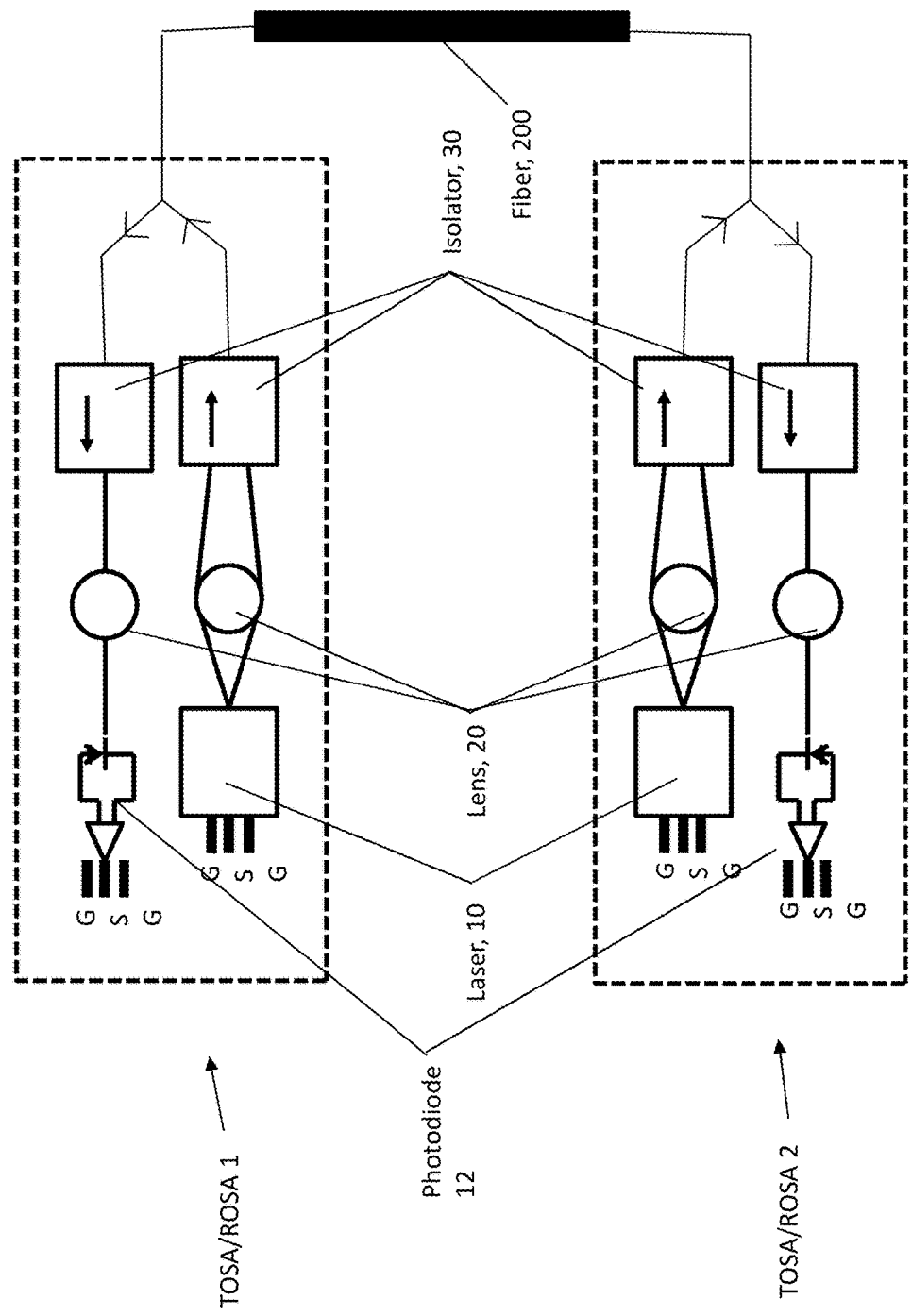
FIG. 7a is a schematic, plan view of a seventh embodiment of a microfabricated optical apparatus with a receiving unit as well as a transmitting unit.

FIG. 7a is a simplified schematic diagram of two microfabricated optical apparatuses, TOSA/ROSA 1 and TOSA/ROSA 2, linked by fiber 200. Both TOSA/ROSA 1 and TOSA/ROSA 2 have both transmit and receive capabilities but uses the microfabricated architecture described above with respect to FIGS. 1-6. As in the previous embodiments, there is once again a laser optical source 10, which produces a beam of light which may be shaped by a ball lens 20, and transmitted through an optical isolator (or Faraday rotator) 30. However, in contrast to the previous embodiments, there are now two ball lenses and two optical isolators in each module TOSA/ROSA 1 and TOSA/ROSA 2. In addition to these components, there is also an optical source 10 as well as an optical detector 12. These components may all be disposed within a device cavity between two substrates, a lid wafer and a device wafer, and form a TOSA/ROSA module. Both substrates may be semiconductor substrates such as silicon, or they may be glass, metal or ceramic.

The optical source 10 may be a light emitting diode, a laser diode, an edge emitting laser diode, a laser diode, or a vertical cavity surface emitting laser, for example. The optical detector 12 may be a photosensitive device such as a photodiode, a photomultiplier, or a charge-coupled device, for example. Accordingly, each TOSA/ROSA module 1, 2 can both generate optical radiation and detect optical radiation. Two such modules may be disposed on an optical fiber cable 200, at either end, as shown in FIG. 7a.

A plurality of through substrate vias (TSVs) may be formed in the device substrate as described above. The through substrate vias may be coupled to the optical source, providing the signal to be encoded by the optical source. Another of the pluralities of TSVs may be coupled to the optical detector 12, carrying the signal generated by the detector in response to impinging light. A waveguide such as a strip line, co-axial cable or co-planar waveguide may be attached to the appropriate respective vias to provide ground ("G"), signal ("S"), and ground ("G") to the microfabricated optical apparatus TOSA/ROSA 1 and TOSA/ROSA 2.

Accordingly, a microfabricated optical apparatus may be fabricated on a substrate, and include a optical source driven by a first signal, wherein the light source generates optical radiation, and an optical detector which generates a second signal based on an amount of optical radiation striking the optical detector, wherein the first and second signals are delivered to the optical source or taken from the optical detector by at least one through silicon via (TSV) which extends through a thickness of the substrate.

Beginning with TOSA/ROSA 1, an optical signal may be generated by optical source 10 and shaped by the beam shaping element, here a ball lens 20. The beam may pass through an optical isolator 30 and enter the fiber optic cable 200. The signal will exit the other end of fiber optic cable 200 and enter TOSAROSA 2. The beam may pass through an optical isolator 30 and beam shaping element 20 which may collimate the beam. The beam then impinges upon the optical detector 12. This constitutes the uni-directional communication, as shown by the arrowheads in FIG. 7a.

Bi-directional communication may occur in reverse, originating in TOSA/ROSA 2. Once again, an optical signal may be generated by optical source 10 in TOSA/ROSA 2, and shaped by the beam shaping element, ball lens 20 in TOSA/ROSA 2. The beam may pass through an optical isolator 30 and enter the fiber optic cable 200. The signal will exit the other end of fiber optic cable 200 and enter TOSA/ROSA 1. The beam may pass through an optical isolator 30 and beam shaping element 20 which may collimate the beam in TOSA/ROSA 1. The beam then impinges upon the optical detector 12. This constitutes the bi-directional communication.

Accordingly, bi-directional communication is enabled by the microfabricated TOSA/ROSA1, 2 as shown in FIG. 7a. The through substrate vias allow very compact packaging with a reduced level of noise, loss and inductive coupling at high frequencies. The microfabricated devices may be smaller, lower cost, lighter weight and less expensive.

Figure 7B:
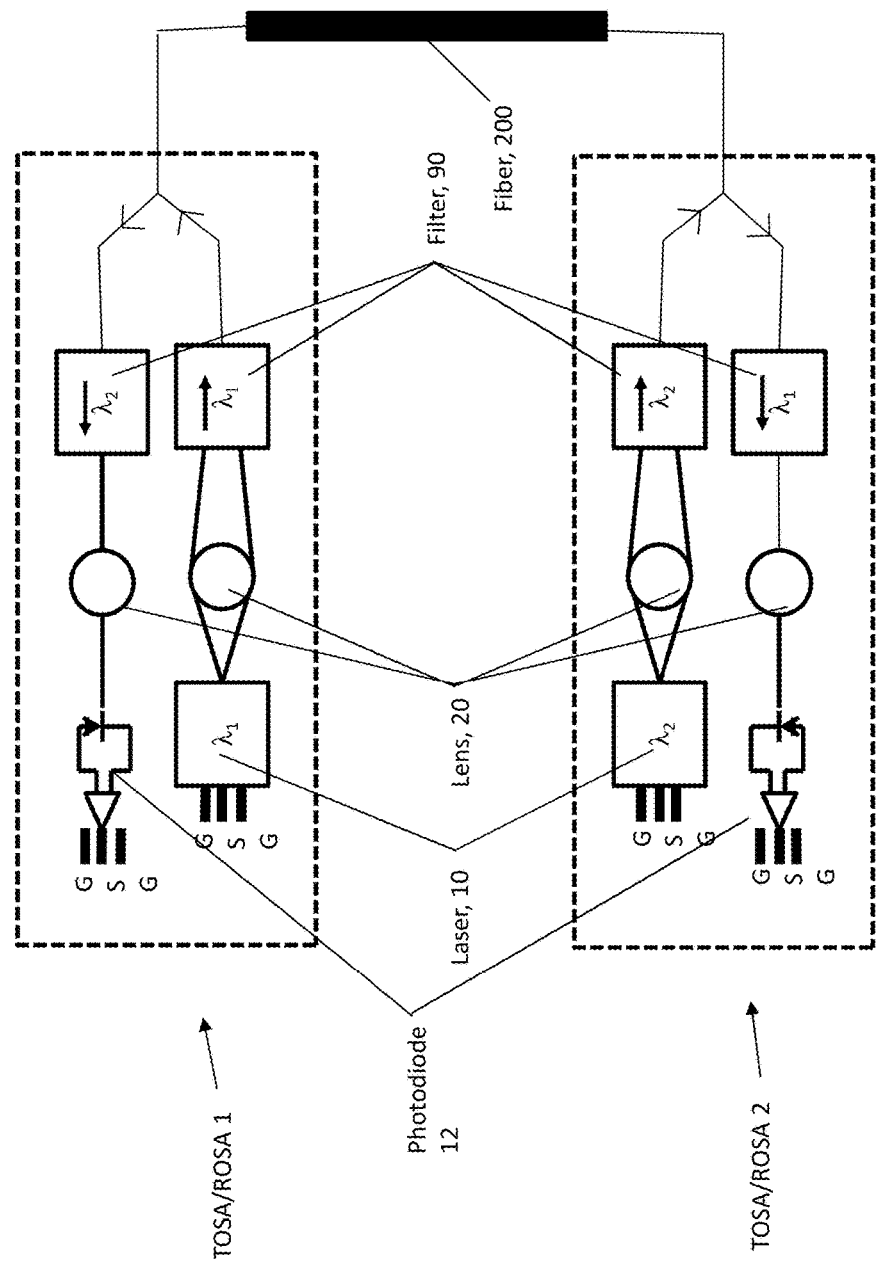
FIG. 7b is a schematic, plan view of a seventh embodiment of a microfabricated optical apparatus using two data channels on different wavelengths.

FIG. 7b is a simplified schematic diagram of another embodiment of two microfabricated optical apparatuses, TOSA/ROSA 1 and TOSA/ROSA 2. Both TOSA/ROSA 1 and TOSA/ROSA 2 have both transmit and receive capabilities but use the microfabricated architecture described above with respect to FIGS. 1-6. As in the previous embodiments, there are once again laser optical sources 10, which produce a beam of light which may be shaped by a ball lens 20, and transmitted through an optical bandpass filter 90. The first laser source 10 in TOSAROSA 1 generates an optical signal at a wavelength $\lambda_1$. Another laser source 10 in TOSAROSA 2 generates an optical signal at a wavelength $\lambda_2$. As before, the radiation may be shaped by lenses 20. The two wavelengths constitute separate channels which can be encoded and multiplexed on the generating end, and demultiplexed and decoded on the receiving end. Accordingly, $\lambda_1$ travels from TOSAROSA 1 down the fiber 200 to TOSAROSA 2. Wavelength $\lambda_2$ travels in reverse from TOSAROSA 2 to TOSAROSA 1. The wavelengths can be separated by a Fabry-Perot filter, etalon or other optical bandpass filter 90. By superposition, the wavelengths can travel through the same fiber 200 and the same time, then be received and separated in order to decode the signal. This concept can be extended to a plurality of wavelengths and optical sources, greatly increasing the data rate of a given fiber optic channel.

Although two channels are shown in FIG. 7b, it should be understood that the concepts may be extended any number of additional channels.

Accordingly, as depicted in FIG. 7b, the microfabricated optical apparatus may comprise a plurality of optical sources, wherein a first optical source outputs a first wavelength, and a second optical source outputs a second wavelength, wherein the first wavelength and the second wavelength allow bi-directional communication in a single optical fiber.

Figure 8:
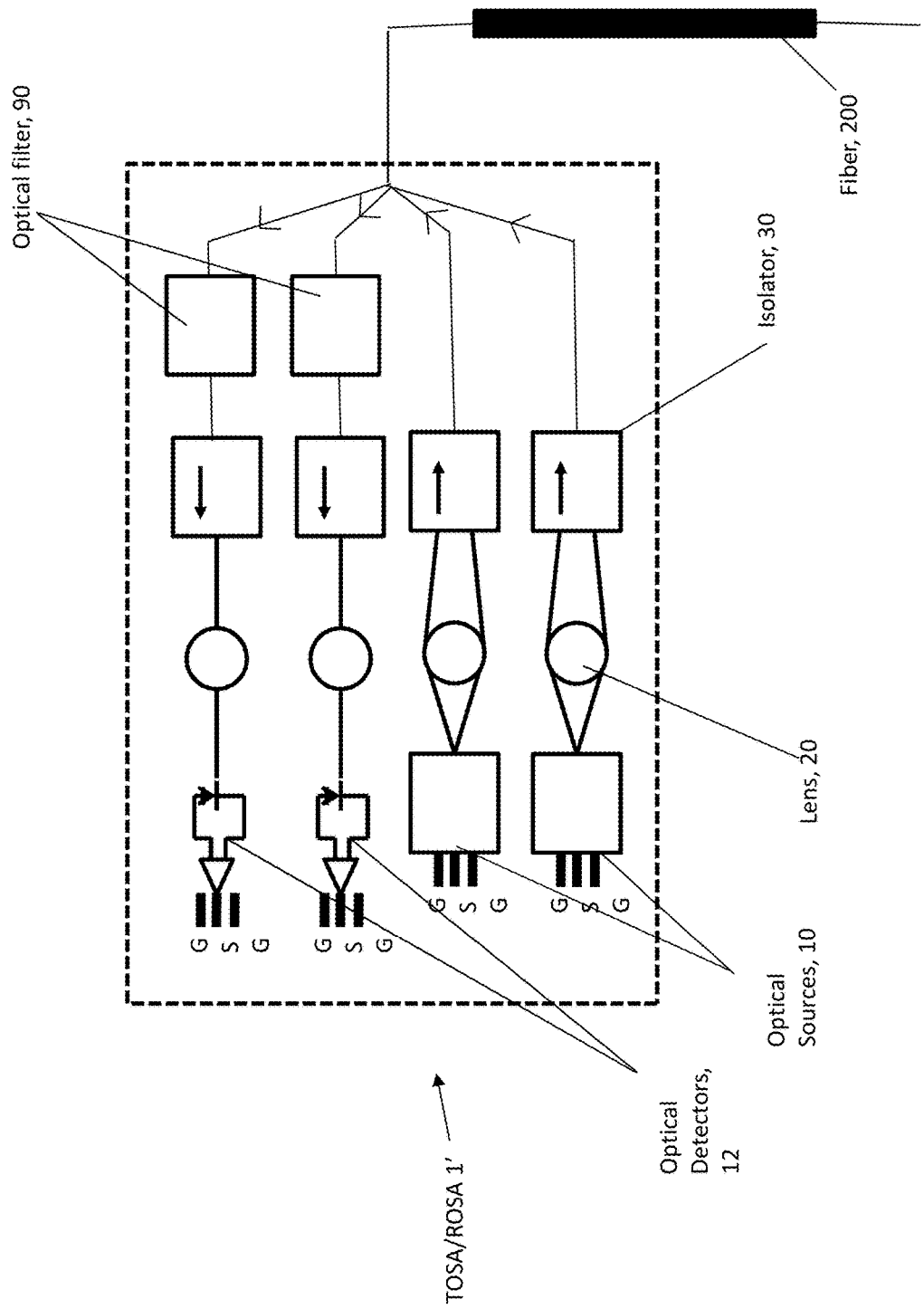
FIG. 8 is a schematic, plan view of an eighth embodiment of a microfabricated optical apparatus with multiple receiving units as well as multiple transmitting units.
Figure 9:
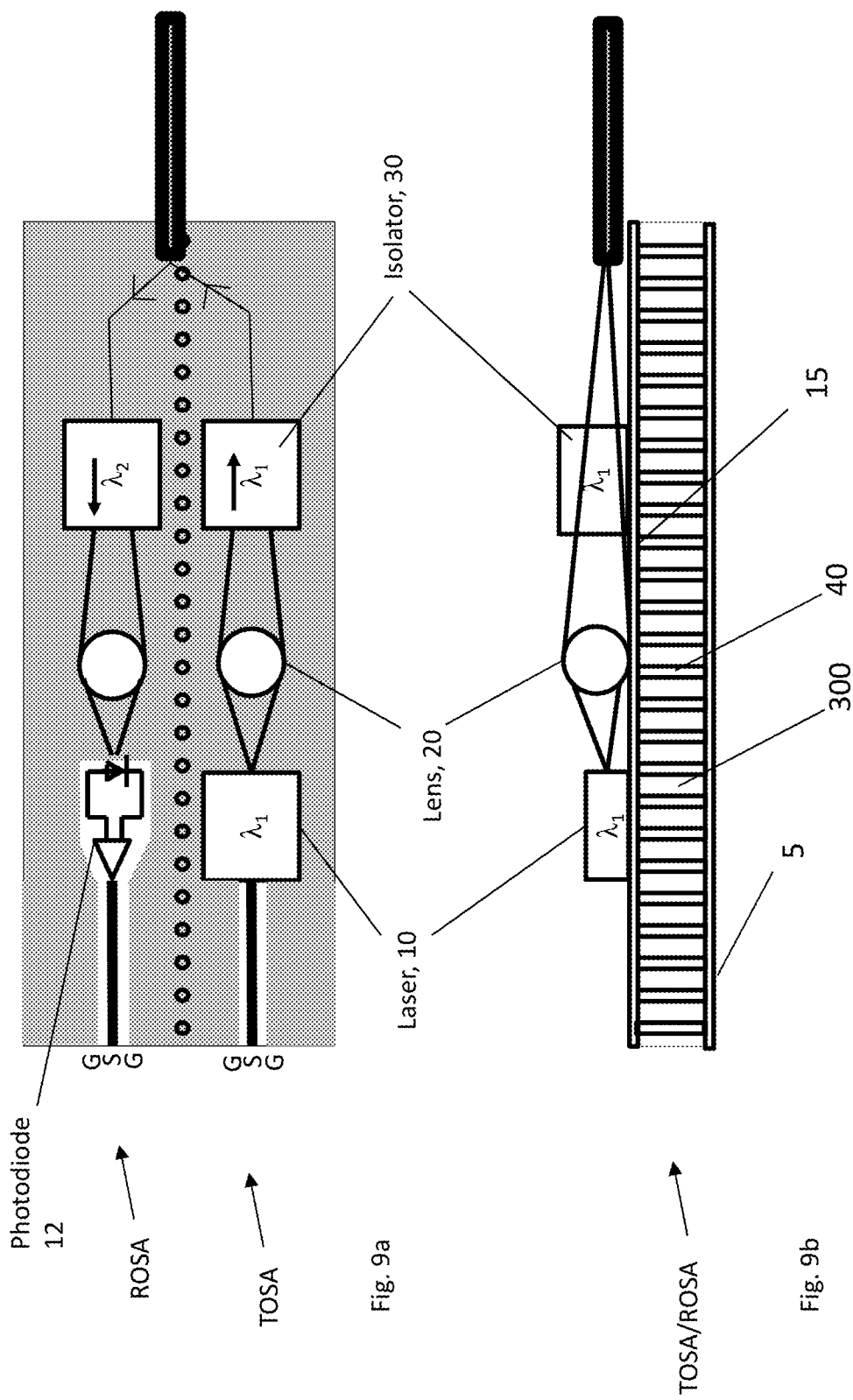
FIG. 9a is a plan view of a substrate with multiple optical apparatuses fabricated thereon, wherein the bondline is grounded at intervals.
FIG. 9b is a cross sectional view of a substrate with multiple optical apparatuses fabricated thereon, wherein the bondline is grounded at intervals.

FIG. 8 is a simplified schematic diagram of another embodiment of a microfabricated optical apparatus TOSA-ROSA 1' which may also have both transmit and receive capabilities as the embodiment shown in FIGS. 7a and 7b. However, in this embodiment, each TOSAROSA 1' has a plurality of optical sources 10 and a plurality of optical detectors 12. Nonetheless, TOSA/ROSA 1' may still use the microfabricated architecture described above with respect to FIGS. 1-7. As in the previous embodiments, there is once again a laser light source 10, which produces a beam of light which may be shaped by a ball lens 20, and is transmitted through an optical isolator (or Faraday rotator) 30. In contrast to the previous embodiments, there are now a plurality of such optical sources 10 and optical detectors 12 in TOSA/ROSA 1'.

This embodiment may be used in applications requiring multiple wavelengths encoding multiple data streams, such as CWDM and DWDM, mentioned above. The modulated signal may be fed to the plurality of optical sources 10 using the through substrate vias shown and described in the previous figures. The output of each of the sources may be injected into an fiber optic cable by a multiplexer, which may simply be the junction shown in FIG. 8.

As before, the optical isolator keeps reflections from entering the device cavity, and the ball lens 20 may shape the optical beam.

On the receiving end, the multi-wavelength signal may exit the fiber optic cable 200 and enter TOSAROSA 1'. The light may be split along different paths, and the optical isolators again prevents radiation traveling backwards through any portion of the system. Radiation passing to the (upper) receiving branch travels through a filter, 90, which separates the different wavelengths of light. Other separation mechanisms such as a rotatable grating or prism may also be used. Each wavelength may then impinge on one of the plurality of detectors.

Accordingly, optical radiation may enter and exit the device cavity through a fiber optic cable. The output from the fiber optic cable may be separated and delivered to the plurality of optical detectors. The apparatus may perform at least one of Coarse Wavelength Divisional Multiplexing (CWDM) and Dense Wavelength Divisional Multiplexing (DWDM), as described above.

It should be understood that a second TOSA/ROSA similar or identical to TOSA/ROSA 1' may be disposed on the other end of fiber optic cable 200, as was shown and described with respect to FIGS. 7a and 7b.

Alternatively, in another embodiment, the bi-directional transmission may use at least two different wavelengths. The wavelengths may be produced by the plurality of optical sources 10 putting out different specific wavelengths. The wavelengths may be separated at detection by an optical band-pass filter 90, such as an etalon or a Fabry-Perot filter. These separation devices may provide better isolation between the transmit and receive channels. And as mentioned, a first optical source may output a first wavelength, and a second optical source may output a second wavelength, wherein the first wavelength and the second wavelength allow bi-directional communication in a single optical fiber.

The embodiments illustrated in FIGS. 1-8 and described above have a number of advantages from a manufacturing perspective. They may be tested in a manufacturing environment with a conventional wafer probe to cull damaged or non-functional die. The design is capable of very high yield in a microfabrication production environment. They each allow integration of multiple lasers and detectors in a single device cavity, as was illustrated in FIGS. 6 and 8, for example.

One technical difficulty of the structure shown in FIG. 8 may be feedthrough of the generated signal noise from the sources 10 to the detectors 12. Accordingly, a large noise source may be collocated in the package with the detector 12. What follows is an approach which may diminish the cross talk between the optical sources 10 and the optical detectors 12, and thus reduce the noise level and improve the overall performance of the device, a TOSA/ROSA.

We describe here a method that employs through substrate vias (TSVs) to frustrate the standing waves that may be formed in the package. Often, a metal layer which is electrically floating may form an antenna that can absorb and re-radiate the signal from the optical source. This reradiated signal may be detected by the optical detector 12 and constitute a major noise source for the detector 12, as the signal is fed through from the optical sources 10 to the optical detectors 12. Feedthrough may also occur directly from sources 10 to detectors 12 by radiating through space. Accordingly, it may be important to the performance of the device to inhibit the coupling between the source 10 and the detector 12. Accordingly, some shielding structure 500 may be needed between the optical sources 10 and the optical detectors 12.

The method described here may form an effective and convenient shield for the optical detector 12, by grounding the metal planes in the structure that would otherwise act like an antenna. Such a structure 500 is shown in FIGS. 9a and 9b.

FIG. 9a shows the plan view of the device, and FIG. 9b shows the device in cross section. As shown in the cross section FIG. 9b, there may be a lower metal ground plane 5 on one surface, and a metal upper layer 20 with patterned traces on the other. The upper metal layer 15 may be deposited on at least one side of the substrate and covering a significant portion of the exposed area of the substrate. The upper metal layer 15 may also be electrically coupled to a ground plane on the obverse side of the substrate by the plurality of through substrate vias (TSVs) 40. It should be understood that metal layer 15 may be patterned or left whole. In some embodiments, the metal layer 15 may be patterned with leads. In some embodiments, the metal layer 15 may be patterned to meet functional and impedance matching objectives. The metal layer 15 may cover at least one half of area of the surface of the substrate, and electrically coupled to a ground plane on the obverse side of the substrate by the plurality of through substrate vias (TSVs), in order to perform as an effective shield.

Of course, the designation "upper" and "lower" is arbitrary, and meant only to indicate that one layer is on one side of a planar substrate, and the other layer is on the obverse side. A "covering a significant portion of the exposed area" may be understood to mean more than one-half of the total area of the surface of the substrate is covered with the metal of the upper metal layer 15.

The metal traces in the upper layer 20 may route electrical signals from a TSV to the TOSA/ROSA, and the lower layer may be a ground plane 5, held at ground potential with respect to the other voltages within the device. Some TSVs may handle the signals being delivered to the optical source 10 or taken from the detector 12, but others may provide the shielding function by grounding the metal upper layer 20 to the ground plane 5, through the TSVs, as described further below.

In one embodiment, TSVs 40 may be formed at intervals in a TSV substrate 300 as shown in FIG. 9b, electrically coupling an metal upper layer 20 to the lower ground plane 5. The interval between the vias may be chosen according to the radiation being handled by the device, such that the radiation modes cannot be supported by the structure. As a result, the upper metal layer 15 may not interfere with the handling of the signals at their characteristic frequency, by coupling the transmitted signal to the signal detector 12. In other words, the spacing is chosen such that the radiative mode cannot be supported by the structure, i.e. the resonator is detuned from the frequency. The required spacing to achieve this suppressive effect is discussed in detail below.

More generally, a microfabricated structure is disclosed which supports signals having a characteristic wavelength of $\lambda$ (which corresponds to a characteristic frequency $\nu$ of between about $c/(\nu^*\varepsilon)$ and $c/(10^*\nu^*\varepsilon)$, where c is the speed of light and epsilon is the dielectric constant of the material). The structure may include a metallic layer such as a bond line or a metal trace layer 15, and a ground plane 5 which may be held at ground potential relative to the other metal layer. A plurality of through wafer vias 40 may extend through the substrate, and define conductive paths between the ground plane 5 and the metal layer 15. The through wafer vias 40 may be disposed at intervals of between about $2\lambda$ and $\lambda/10$.

A method for fabricating this structure is also disclosed, and may include disposing an optical source driven by a first signal with a characteristic frequency of $\nu$ on a substrate, wherein the optical source generates optical radiation, disposing an optical detector on the same substrate, which generates a second signal based on an amount of optical radiation striking the optical detector, wherein the first and second signals are delivered to the optical source or taken from the optical detector by a plurality of through silicon vias (TSV) which extend through a thickness of the substrate. The method may then further include forming a plurality of through wafer vias extending through at least one of a first substrate and a second substrate, that define a conductive path between a ground plane and a metallic bonding material, wherein the through substrate vias are disposed at intervals of between about $c/(v*\varepsilon)$ and $c/(10*v*\varepsilon)$, where c is the speed of light and epsilon is the dielectric constant of the substrate, and depositing an upper metal trace material on the substrate and electrically coupling the upper metal trace material to a ground plane by the plurality of through substrate vias (TSVs). Finally, the method may include forming the ground plane which is held at ground potential relative to the wafer bonding material.

Because the metal layer 15 can no longer support the modes of the signal, the signal is not transmitted readily from the sources 10 to the detectors 12. In other words. the metal layer 15 no longer interferes, by absorption and/or re-radiation, of the RF signal.

In this structure, there may be a ground plane 5 on one surface, which is a very low resistivity film such as Au or Al and is grounded to external circuitry in several places. This film may be 0.5-3.0 um in thickness, and is typically about 1 micron thick. The upper metal layer 15 is also typically Au, with a thickness of between 0.5-3.0 um. Rather than gold, however, the upper and lower layers may alternatively comprise aluminum, platinum, copper or silver, a noble metal, and a metal alloy, for example, and may again be about 1 micron thick. Some metal materials may need to be passivated, such as with a metal oxide layer, to avoid oxidation of the entire metal material. The metal material may be deposited by plating, ion beam deposition, or sputtering, for example.

In the figures that follow, 5 may be a ground plane, 10 may be a substrate, 40 may be one of a plurality of TSVs, 15 may be an upper metal layer which may have electrical traces formed therein, 50 may be a lid substrate.

Numerous ways for depositing a conductive material into a through hole or blind hole may be found in the literature and are known to those skilled in the art for making the through substrate vias 40. Several such methods are described briefly below.

As mentioned previously, long, narrow vias 40 are often created by plating a conductive material into a blind hole formed in a substrate. Such a hole may be created in a substrate by, for example, a directional material removal process such as reactive ion etching (RIE). A seed layer may then be deposited conformally over the etched surface, to provide a conductive seed layer to attract the plating material from a plating bath. The hole may then be filled by plating onto the seed layer with a conductive material. Subsequently, the blind end wall of the hole may be removed by etching, sawing or grinding, for example, which may create a via that extends through the thickness of the substrate. Other methods of forming through substrate vias was discussed previously.

In one embodiment, the substrate 300 may be a portion of a silicon-on-insulator (SOI) substrate. The vias 40 may be formed through the thickness of the device layer, extending to the buried oxide by deep reactive ion etching (DRIE). The handle layer may now be removed to complete the backside processing. In another embodiment, a regular, monolithic silicon substrate may be used. In this case, the via may be formed as a blind hole partially through the substrate from the frontside. The backside may subsequently be ground or etched away. In other embodiments, the substrate 10 may be metal, glass, ceramic or sapphire for example. More generally, the substrate 10 may be any metal or metal alloy with at least one component of the alloy chosen from column II or III of the periodic table and another component chosen from column V or VI. Exemplary materials include gallium arsenide (GaAs), gallium nitride (GaN), aluminum nitride (AlN), indium arsenide (InAs), and indium phosphide (InP), among many others that can make use of this structure and method.

As seen in the cross section of FIG. 9*b*, a ground plane 5 is disposed adjacent to a substrate 300 which has a upper metal layer 15 which delivers signals and voltages to the components in the TOSA/ROSA as described above. The upper metal layer 15 may be a uniformly deposited layer of a conductor such as copper or gold, for example, which may then be patterned to form metal traces. The upper metal layer 15 may be patterned by covering portions of upper metal layer 15 with a patterned photoresist coating and then etching or milling the exposed areas of upper metal layer 15, for example. Although only one is shown, it should be understood that there may be a plurality of sources 10 and detectors 12, as depicted elsewhere.

A plurality of through substrate vias 40 may be formed in the first substrate 300. These vias 40 may, of course, be filled with a conductive material as described above, and therefore constitute a conductive path between the ground plane 5 and the upper metal layer 15. Accordingly, the through substrate vias 40 effectively ground the upper metal layer 15 at various intervals around the upper metal layer 15. The intervals between the TSVs 40 are in general a fraction of the characteristic wavelength of the signal, for example, between about 2λ and λ/10. If considered in terms of a characteristic frequency ν, the through wafer vias 15 may be disposed at intervals of between about $c/(v*\varepsilon)$ and $c/(10*v*\varepsilon)$, where c is the speed of light and epsilon is the dielectric constant of the material.

The architecture shown in FIGS. 9*a* and 9*b* and described above may effectively suppress signals at the operating frequency of the TOSA/ROSA, thereby improving noise, loss and overall performance of the device. Even better isolation may be accomplished by packaging the TOSA/ROSA in a lid wafer with a pair of device cavities which encapsulate the TOSA portion separately from the ROSA portion, as described next. This approach is illustrated by FIG. 10.

Figure 10:
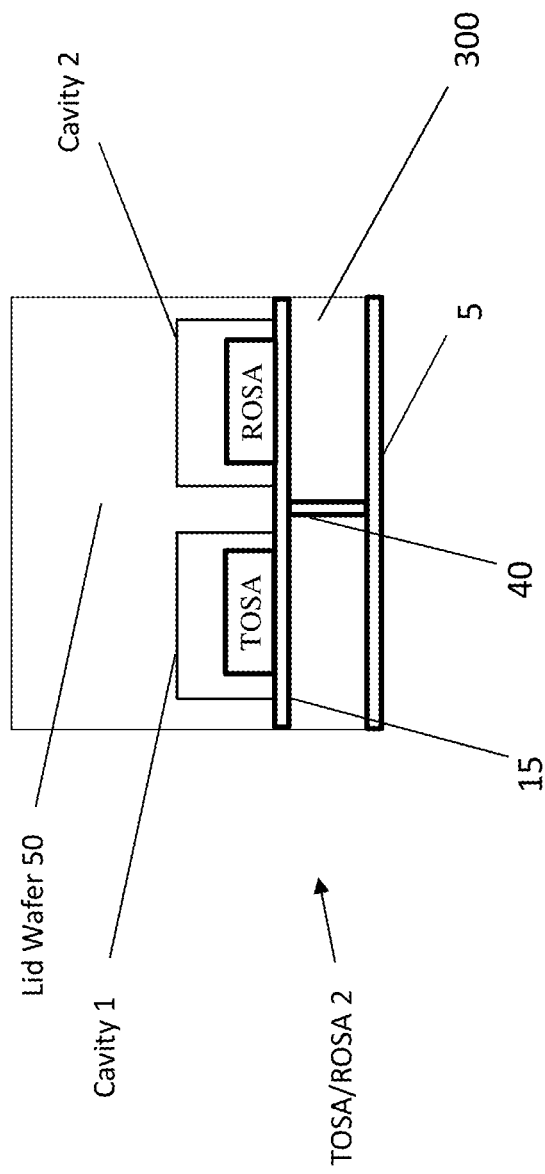
FIG. 10 is a cross sectional view of a TOSA/ROSA structure encapsulated with a lid wafer which isolates the TOSA from the ROSA.

The features described previously with respect to FIGS. 1-9 may also be applied to the embodiment illustrated in FIG. 10. In particular, the microfabricated optical apparatus may further include a lid wafer with a device cavity formed therein, wherein the device cavity encapsulates the optical apparatus. The device cavity may encapsulate a plurality of light sources and a plurality of optical detectors. The output from the plurality of light sources may be combined in an optical multiplexer.

The signal may be a direct current electrical signal which is applied to the through silicon via. The apparatus may also include a device which modulates at least one of a frequency and an amplitude, to encode the optical radiation emitted from the light source with an information signal, and at least one optical isolator also disposed within the device cavity. The optical source may be at least one of a light emitting diode, a laser diode, an edge emitting diode, a laser diode. and a vertical cavity surface emitting laser. The optical detector may be a photodiode.

FIG. 10 depicts a two-cavity lid wafer 50. Dual cavity lid wafer 50 may have a first cavity 1 and a second cavity 2. The cavities 1 and 2 may be formed by, for example, anisotropic etching. First cavity 1 may encapsulate the TOSA and second cavity 2 may encapsulate the ROSA. The lid wafer may be bonded by a bonding material on all contacting edges, using for example a gold compression bond or a metal alloy bond. In FIG. 10, the upper metal layer 15 may also be the bonding material which bonds lid wafer 50 to the substrate 150. The material remaining between the first cavity 1 and the second cavity 2 may inhibit the transmission of the signal from the optical source 10 in the TOSA to the optical detector, 12 in the ROSA.

The first substrate 300 may then be bonded to the lid substrate 50 with a metallic adhesive bonding material, for example. The bond seal may be made when the two wafers are bonded together using a malleable metal, such as Au, on each wafer. These two layers can be compressed together to form a thermo-compression bond or they can be soldered together by depositing a metal, for instance In or Sn, that readily alloys with a gold metal to form an alloy bond when a thermal cycle is applied to create the alloy. This metal bondline 20 may be grounded at intervals as described herein, so that it is no longer electrically floating. As a result, the bondline may no longer act as a receiver or antenna for RF radiation at the characteristic frequency of the RF signal, and thus interfere with the functioning of the device. TSVs 40 may then be formed at intervals in the first substrate, electrically coupling the metal layer to the ground plane 5. The first substrate may then be bonded to a second substrate with a metallic adhesive bonding material.

The TSVs 40 may also exist in a periphery surrounding cavity 1 and cavity 2, as well as in the area between cavity 1 and cavity 2. The TSVs 40 may be located randomly throughout these structures or they may be located primarily in the areas described, and especially in the median areas between the TOSA and the ROSA. But in any case, the interval between the TSVs 40 is typically less that ¼ of the wavelength of the signal in the material.

Figure 11:
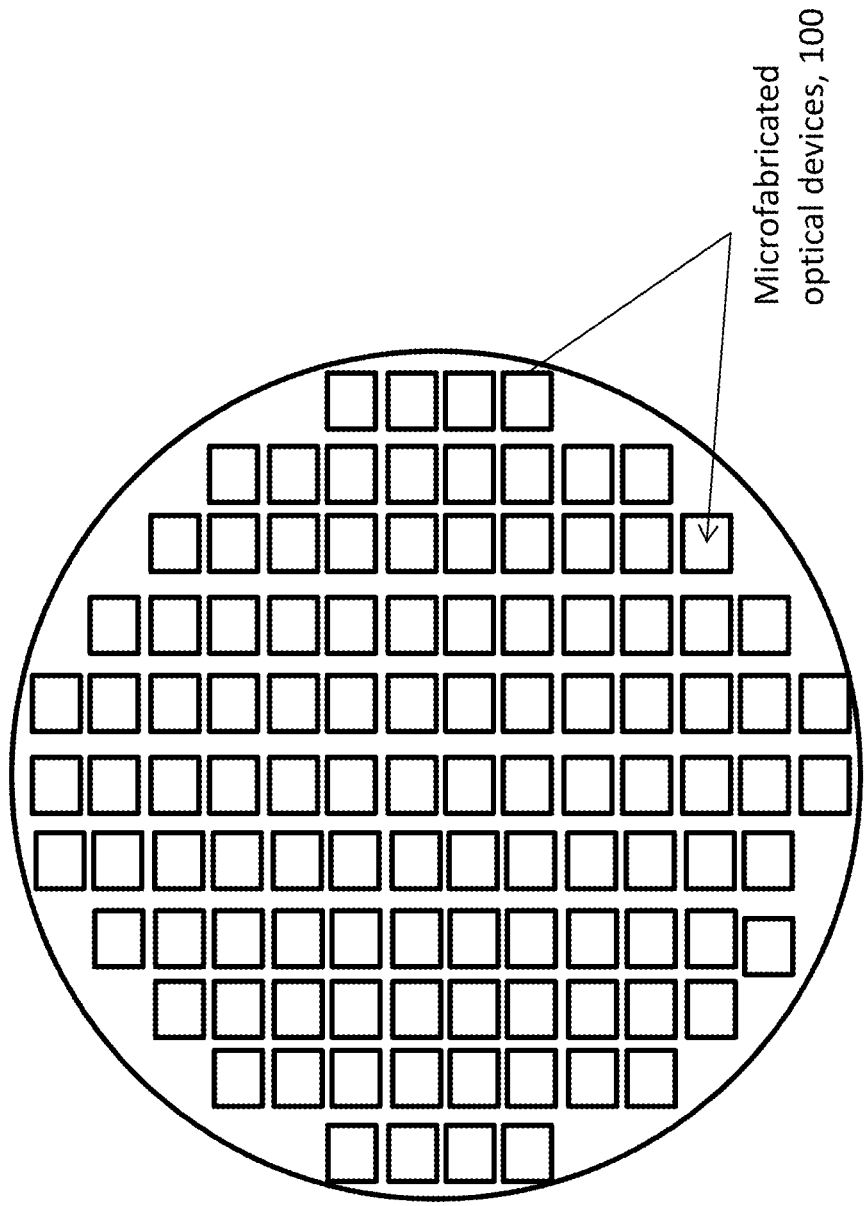
FIG. 11 is a plan view of a substrate with multiple optical apparatuses fabricated thereon.

FIG. 11 is a simplified plan view of a fabrication substrate during processing in a manufacturing environment. As was described previously, the manufacturing method may be capable of fabricating a large number of like devices on a single fabrication substrate 100. These devices may each be microfabricated optical apparatuses 200. This fabrication substrate may be bonded to a lid substrate (not shown) with cavities and perhaps other structures previously formed therein, and registered with the optical apparatuses 200, to form a two-substrate assembly. The individual devices may they be singulated by sawing, dicing or grinding.

Accordingly, a microfabricated optical apparatus may be fabricated on a substrate. It may include an optical source driven by a first signal with a characteristic frequency of ν, wherein the optical source generates optical radiation, an optical detector which generates a second signal based on an amount of optical radiation striking the optical detector, wherein the first and second signals are delivered to the optical source or taken from the optical detector by a plurality of through silicon vias (TSV) which extend through a thickness of the substrate, and a metallic layer deposited on at least one side of the substrate and covering at least one half of area of the surface of the substrate, and electrically coupled to a ground plane on the obverse side of the substrate by the plurality of through substrate vias (TSVs).

The through wafer vias may be disposed at intervals of between about $c/(\nu*\varepsilon)$ and $c/(10*\nu*\varepsilon)$, where c is the speed of light and epsilon is the dielectric constant of the substrate. The ground plane may be a layer of at least one of copper, gold, silver and platinum about 1 micron thick and electrically connected to ground potential. The metallic layer may be at least one of gold, aluminum, platinum, copper, silver a noble metal, and a metal alloy. The interval may be about one quarter of the wavelength of the signal in the substrate.

The substrate may be at least one of silicon, metal, glass and ceramic, a metal and a metal alloy with at least one component of the alloy chosen from column II or III of the periodic table, and another component chosen from column V and VI of the periodic table. The plurality of through wafer vias may comprise a plurality of at least one of copper, nickel, gold and silver vias, and wherein the ground plane is a layer of at least one of copper, gold, silver and platinum about 1 micron thick.

The microfabricated optical apparatus may further comprise a lid wafer with two device cavities formed therein, wherein one device cavity encapsulates the optical source, and the other device cavity encapsulates the optical detector. The TSVs may be located at least between the optical source and the optical detector. The microfabricated optical apparatus of claim 8, wherein the TSVs are located between the optical source and the optical detector, and in regions where the lid wafer is bonded to the substrate.

The microfabricated optical apparatus may further comprise a device which modulates at least one of a frequency and an amplitude, to encode the optical radiation emitted from the light source with an information signal, and at least one optical isolator also disposed within the device cavity. The optical source may be at least one of a light emitting diode, a laser diode, an edge emitting laser diode, a laser diode, and a vertical cavity surface emitting laser, and wherein the optical detector is a photodiode.

The microfabricated optical apparatus may perform performs at least one of Coarse Wavelength Divisional Multiplexing (CWDM) and Dense Wavelength Divisional Multiplexing (DWDM).

Accordingly, a method is described for forming an optical apparatus which supports signals having a characteristic wavelength of λ corresponding to a characteristic frequency of ν. The method may include disposing an optical source driven by a first signal with a characteristic frequency of ν on a substrate, wherein the optical source generates optical radiation, disposing an optical detector on the substrate, which generates a second signal based on an amount of optical radiation striking the optical detector, wherein the first and second signals are delivered to the optical source or taken from the optical detector by a plurality of through silicon vias (TSV) which extend through a thickness of the substrate.

The method may further include forming a plurality of through wafer vias extending through the substrate, that define a conductive path between a ground plane on one side of the substrate and a metal material on the obverse side of the substrate, wherein the through substrate vias are disposed at intervals of between about $c/(\nu*\varepsilon)$ and $c/(10*\nu*\varepsilon)$, where c is the speed of light and epsilon is the dielectric constant of the substrate, and wherein the metal material covers at least one half of the exposed area of the surface of the substrate. The method may further include forming the ground plane which is held at ground potential relative to the wafer bonding material, and electrically coupling the metal material to the ground plane by the plurality of through substrate vias (TSVs).

In the method, the metal material may be at least one of gold, a noble metal, a metal alloy and a gold/indium alloy, and the interval may be about λ/4. At least one of the substrates may be at least one of a silicon, metal, glass and ceramic substrate, a metal and a metal alloy with at least one component of the alloy chosen from column II or III of the periodic table, and another component chosen from column V and VI of the periodic table.

The method may further include bonding the substrate to a lid wafer with two cavities formed therein, wherein the two cavities encapsulate the optical detector in a separate cavity from the optical source. The method may further include forming the plurality of through substrate vias in a region between the optical source and the optical detector. The method may further include forming the plurality of through substrate vias in peripheral regions around the optical source and the optical detector.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A microfabricated optical apparatus fabricated on a substrate, comprising:
    an optical source driven by a first signal with a characteristic frequency of ν, wherein the optical source generates optical radiation;
    an optical detector which generates a second signal based on an amount of optical radiation striking the optical detector, wherein the first and second signals are delivered to the optical source or taken from the optical detector by a at least some of a plurality of through silicon vias (TSV) which extend through a thickness of the substrate; and
    a metallic layer deposited on a first side of the substrate and covering at least one half of area of the surface of the substrate; and
    a ground plane formed on the obverse side of the substrate and electrically coupled to the metallic layer by others of the plurality of through substrate vias (TSVs).

2. The microfabricated optical apparatus of claim 1, wherein the through wafer vias are disposed at intervals of between about $c/(\nu*\varepsilon)$ and $c/(10*\nu*\varepsilon)$, where c is the speed of light and epsilon is the dielectric constant of the substrate.

3. The microfabricated structure of claim 1, wherein the ground plane is a layer of at least one of copper, gold, silver and platinum about 1 micron thick and electrically connected to ground potential.

4. The microfabricated structure of claim 1, wherein the others of the plurality of TSVs are distributed in random locations on the substrate, and do not carry power or signal to or from the optical source or the optical detector.

5. The microfabricated structure of claim 1, wherein the interval is about one quarter of the wavelength of the signal in the substrate.

6. The microfabricated structure of claim 1, wherein the substrate is at least one of silicon, metal, glass and ceramic, a metal and a metal alloy with at least one component of the alloy chosen from column II or III of the periodic table, and another component chosen from column V and VI of the periodic table.

7. The microfabricated structure of claim 1, wherein the plurality of through wafer vias comprises a plurality of at least one of copper, nickel, gold and silver vias, and wherein the ground plane is a layer of at least one of copper, gold, silver and platinum about 1 micron thick.

8. The microfabricated optical apparatus of claim 1, further comprising a lid wafer with two device cavities formed therein, wherein one device cavity encapsulates the optical source, and the other device cavity encapsulates the optical detector.

9. The microfabricated optical apparatus of claim 1, wherein the TSVs are located in a region between the optical source and the optical detector.

10. The microfabricated optical apparatus of claim 8, wherein the others o the plurality of TSVs are located between the optical source and the optical detector, and in regions where the lid wafer is bonded to the substrate.

11. The microfabricated optical apparatus of claim 1, further comprising:
    a device which modulates at least one of a frequency and an amplitude, to encode the optical radiation emitted from the light source with an information signal; and
    at least one optical isolator also disposed within the device cavity.

12. The microfabricated optical apparatus of claim 1, wherein the optical source is at least one of a light emitting diode, a laser diode, an edge emitting laser diode, a laser diode, and a vertical cavity surface emitting laser, and wherein the optical detector is a photodiode.

13. The microfabricated optical apparatus of claim 1, wherein the apparatus performs at least one of Coarse Wavelength Divisional Multiplexing (CWDM) and Dense Wavelength Divisional Multiplexing (DWDM).

14. A method for forming a optical apparatus which supports signals having a characteristic wavelength of λ corresponding to a characteristic frequency of ν, comprising:
    disposing an optical source driven by a first signal with a characteristic frequency of ν on a substrate, wherein the optical source generates optical radiation;
    disposing an optical detector on the substrate, which generates a second signal based on an amount of optical radiation striking the optical detector, wherein the first and second signals are delivered to the optical source or taken from the optical detector by a plurality of through silicon vias (TSV) which extend through a thickness of the substrate;
    forming a plurality of through wafer vias extending through the substrate, that define a conductive path between a ground plane on one side of the substrate and a metal material on the obverse side of the substrate, wherein the through substrate vias are disposed at intervals of between about $c/(\nu*\varepsilon)$ and $c/(10*\nu*\varepsilon)$, where c is the speed of light and epsilon is the dielectric constant of the substrate, and wherein the metal material covers at least one half of the exposed area of the surface of the substrate;
    forming the ground plane which is held at ground potential relative to the wafer bonding material; and
    and electrically coupling the metal material to the ground plane by the plurality of through substrate vias (TSVs).

15. The method of claim 14, wherein the metal material is at least one of gold, a noble metal, a metal alloy and a gold/indium alloy.

16. The method of claim 14, wherein the interval is about λ/4.

17. The method of claim 14, wherein at least one of the substrate is at least one of a silicon, metal, glass and ceramic substrate, a metal and a metal alloy with at least one component of the alloy chosen from column II or III of the periodic table, and another component chosen from column V and VI of the periodic table.

18. The method of claim 1, further comprising:
bonding the substrate to a lid wafer with two cavities formed therein, wherein the two cavities encapsulate the optical detector in a separate cavity from the optical source.

19. The method of claim 14, further comprising:
forming the plurality of through substrate vias in a region between the optical source and the optical detector.

20. The method of claim 19, further comprising:
forming the plurality of through substrate vias in peripheral regions around the optical source and the optical detector.

* * * * *